(12) United States Patent
Masuda et al.

(10) Patent No.: US 10,277,190 B2
(45) Date of Patent: Apr. 30, 2019

(54) MULTILAYER FILTER

(71) Applicant: Murata Manufacturing Co., Ltd., Nagaokakyo-shi, Kyoto-fu (JP)

(72) Inventors: Hiroshi Masuda, Nagaokakyo (JP); Rumiko Yuasa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 30 days.

(21) Appl. No.: 15/658,452

(22) Filed: Jul. 25, 2017

(65) Prior Publication Data

US 2018/0034436 A1 Feb. 1, 2018

(30) Foreign Application Priority Data

Jul. 29, 2016 (JP) ................. 2016-149554

(51) Int. Cl.
| | |
|---|---|
| *H03H 7/01* | (2006.01) |
| *H03H 7/03* | (2006.01) |
| *H01F 17/00* | (2006.01) |
| *H03H 1/00* | (2006.01) |

(52) U.S. Cl.
CPC ....... *H03H 7/0115* (2013.01); *H01F 17/0013* (2013.01); *H03H 7/03* (2013.01); *H03H 7/1725* (2013.01); *H03H 7/1758* (2013.01); *H03H 7/1766* (2013.01); *H01F 2017/0026* (2013.01); *H03H 2001/0085* (2013.01)

(58) Field of Classification Search
CPC ......... H03H 7/0115; H03H 2001/0085; H03H 7/1725; H03H 7/1758

USPC ................................................ 333/175, 185
See application file for complete search history.

(56) References Cited

U.S. PATENT DOCUMENTS

| | | | |
|---|---|---|---|
| 9,929,710 B2* | 3/2018 | Tanaka | ..................... H01G 4/40 |
| 2009/0189714 A1 | 7/2009 | Sakisaka et al. | |
| 2009/0189715 A1 | 7/2009 | Sakisaka et al. | |
| 2015/0054599 A1 | 2/2015 | Kitajima | |
| 2017/0170800 A1* | 6/2017 | Saito | ....................... H01F 19/06 |
| 2017/0338030 A1* | 11/2017 | Miyahara | ............ H01F 27/2804 |

FOREIGN PATENT DOCUMENTS

| | | |
|---|---|---|
| JP | 2004-079973 A | 3/2004 |
| JP | 2009-182376 A | 8/2009 |
| JP | 2009-182377 A | 8/2009 |
| WO | 2013-164929 A1 | 11/2013 |

OTHER PUBLICATIONS

Official Communication issued in Japanese Patent Application No. 2016-149554, dated Nov. 13, 2018.

* cited by examiner

*Primary Examiner* — Rakesh B Patel
(74) *Attorney, Agent, or Firm* — Keating & Bennett, LLP

(57) ABSTRACT

A multilayer filter includes dielectric layers, a first terminal, a second terminal, a first inductor, a second inductor, and first to fifth capacitors. In a stacking direction of the dielectric layers, at least one of a first air-core portion defined by the first inductor and a second air-core portion defined by the second inductor includes, in a region from the first inductor layer to the second inductor layer, a region enabling magnetic flux to pass therethrough without being obstructed by the first to fifth capacitors and the third inductor.

11 Claims, 6 Drawing Sheets

MULTILAYER FILTER

CROSS REFERENCE TO RELATED APPLICATIONS

This application claims the benefit of priority to Japanese Patent Application No. 2016-149554 filed on Jul. 29, 2016. The entire contents of this application are hereby incorporated herein by reference.

BACKGROUND OF THE INVENTION

1. Field of the Invention

The present invention relates to a multilayer filter provided with an LC resonator.

2. Description of the Related Art

Hitherto, a multilayer filter provided with an LC resonator has been known. For example, Japanese Unexamined Patent Application Publication No. 2009-182376 discloses a multilayer low pass filter provided with an LC parallel resonator and an LC series resonator. According to the multilayer low pass filter, the attenuation may be especially increased in a specific narrow frequency band present in the stop band of the low pass filter.

There is a tendency for multilayer filters to be made smaller in size due to a strong demand for size reduction arising from the design of recent portable wireless communication devices. As a multilayer filter is miniaturized, there are more constraints regarding an arrangement space for inductors and capacitors within the multilayer filter. As the multilayer low pass filter disclosed in Japanese Unexamined Patent Application Publication No. 2009-182376, the air-core portion defined by an inductor may be obstructed by a capacitor or another inductor in the stacking direction of dielectric layers (hereinafter may also simply referred to as stacking direction).

In the case where the air-core portion of an inductor is obstructed by a capacitor in the stacking direction, most of the magnetic flux generated at the air-core portion is blocked by an electrode of the capacitor. As a result, an eddy current occurs at the electrode, which generates heat (eddy-current loss). The greater the eddy-current loss, the greater the insertion loss.

SUMMARY OF THE INVENTION

Preferred embodiments of the present invention reduce the insertion loss of multilayer filters.

According to a preferred embodiment of the present invention, a multilayer filter includes a plurality of dielectric layers, a first LC parallel resonator, a second LC parallel resonator, and an LC series resonator. The first LC parallel resonator includes a first inductor and a first capacitor. The second LC parallel resonator includes a second inductor and a second capacitor. The LC series resonator includes third to fifth capacitors and a third inductor. One end of the third inductor is connected to a ground point. The plurality of dielectric layers include a first inductor layer, a second inductor layer, and a capacitor layer. In the first inductor layer, the first inductor and the second inductor are provided. In the second inductor layer, the third inductor is provided. In the capacitor layer, the first to fifth capacitors are provided. The capacitor layer is located between the first inductor layer and the second inductor layer. In the stacking direction of the plurality of dielectric layers, at least one of a first air-core portion defined by the first inductor and a second air-core portion defined by the second inductor includes, in the region from the first inductor layer to the second inductor layer, a region enabling magnetic flux to pass therethrough without being obstructed by the first to fifth capacitors and the third inductor.

According to a multilayer filter according to a preferred embodiment of the present invention, in the region from the first inductor layer to the second inductor layer in the stacking direction of the plurality of dielectric layers, a region enabling magnetic flux to pass therethrough without being obstructed by the first to fifth capacitors and the third inductor is present in at least one of the first air-core portion defined by the first inductor and the second air-core portion defined by the second inductor. Thus, according to a multilayer filter according to preferred embodiments of the present invention, the eddy-current loss is able to be reduced compared with the case where both the first air-core portion and the second air-core portion are obstructed by capacitors or inductors. As a result, the insertion loss of the multilayer filter is reduced.

The above and other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
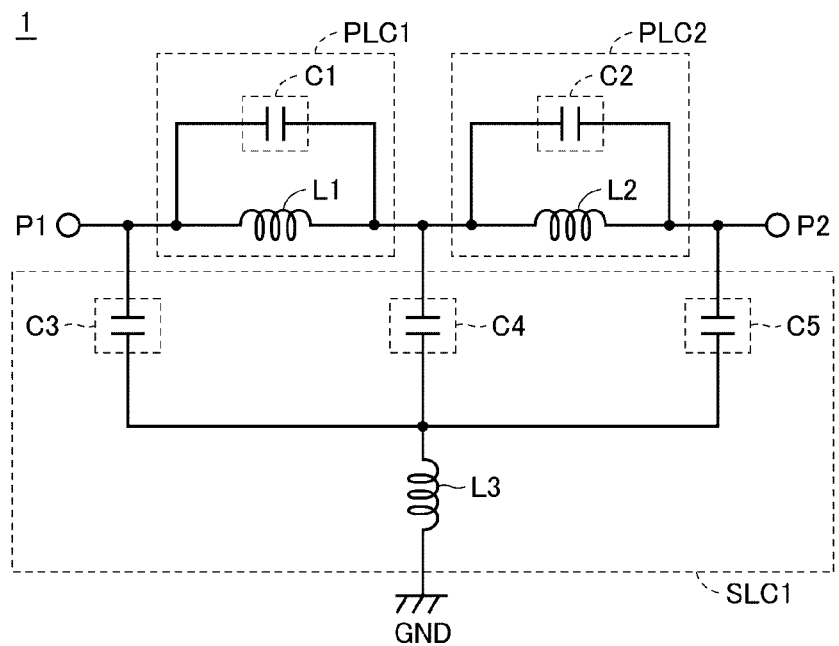
FIG. 1 is an equivalent circuit diagram of a low pass filter that is an example of a multilayer filter according to a preferred embodiment of the present invention.

In the following, preferred embodiments of the present invention will be described in detail with reference to the drawings. Note that the same portions or corresponding portions in the drawings are denoted by the same reference numerals and the description thereof will not be basically repeated.

FIG. 1 is an equivalent circuit diagram of a low pass filter 1, which is an example of a multilayer filter according to a preferred embodiment of the present invention. As illustrated in FIG. 1, the low pass filter 1 includes input-output terminals P1 and P2, LC parallel resonators PLC1 and PLC2, and an LC series resonator SLC1.

The LC parallel resonator PLC1 includes an inductor L1 and a capacitor C1. One end of the inductor L1 is connected to the input-output terminal P1. The capacitor C1 is connected in parallel with the inductor L1.

The LC parallel resonator PLC2 includes an inductor L2 and a capacitor C2. The inductor L2 is connected between the other end of the inductor L1 and the input-output terminal P2. The capacitor C2 is connected in parallel with the inductor L2.

The LC series resonator SLC1 includes capacitors C3 to C5 and an inductor L3. One end of the inductor L3 is connected to a ground electrode GND. The capacitor C3 is connected between the other end of the inductor L3 and the input-output terminal P1. The capacitor C4 is connected between the other end of the inductor L3 and the other end of the inductor L1. The capacitor C5 is connected between the other end of the inductor L3 and the input-output terminal P2.

Figure 2:
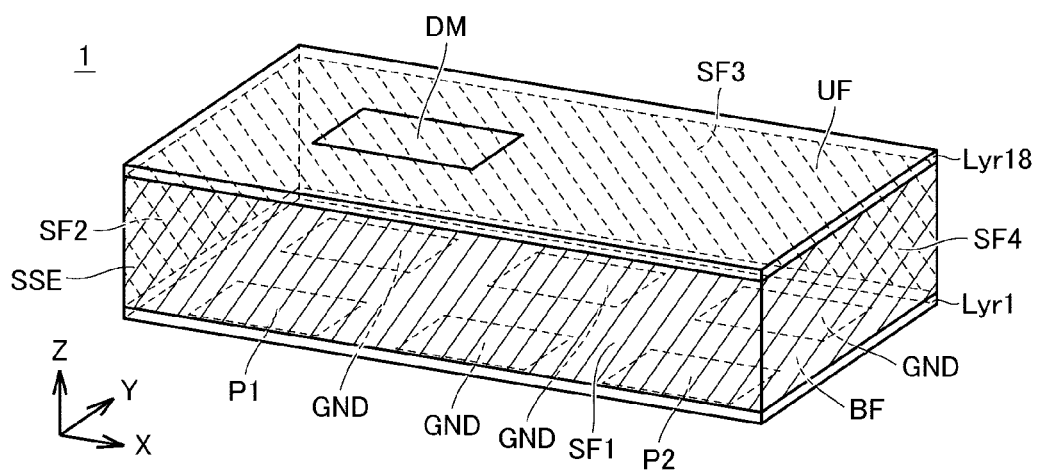
FIG. 2 is an external perspective view of the low pass filter illustrated in FIG. 1.

In the following, the case where the low pass filter 1 includes a multilayer body including a plurality of dielectrics will be described. As illustrated in FIG. 2, the stacking direction (the direction of the height of the low pass filter 1) is set as the Z-axis direction. The direction of the longer side of the low pass filter 1 (across the width of the low pass filter 1) is set as the X-axis direction. The direction of the shorter side of the low pass filter 1 (farther from the viewer of FIG. 2) is set as the Y-axis direction. The X-axis, Y-axis, and Z-axis are perpendicular to each other.

FIG. 2 is an external perspective view of the low pass filter 1 illustrated in FIG. 1. As illustrated in FIG. 2, the low pass filter 1 has, for example, a rectangular or substantially rectangular parallelepiped shape. The surfaces of the low pass filter 1 perpendicular to the stacking direction are a bottom surface BF and an upper surface UF. The surfaces parallel to the ZX-plane among the surfaces of the low pass filter 1 parallel to the stacking direction are side surfaces SF1 and SF3. The surfaces parallel to the YZ-plane among the surfaces of the low pass filter 1 parallel to the stacking direction are side surfaces SF2 and SF4.

The bottom surface BF has the input-output terminals P1 and P2 and four ground electrodes GND located thereon. The input-output terminals P1 and P2 and the four ground electrodes GND are, for example, a land grid array (LGA) that is a plane electrode arranged to have a mesh shape on the bottom surface BF.

The upper surface UF has a direction identification mark DM located thereon. The direction identification mark DM is used to identify the orientation of the low pass filter 1 at the time of being mounted.

The side surfaces SF1 to SF4 have a shield electrode SSE located thereon. The shield electrode SSE is not provided on the side surfaces of a dielectric layer Lyr1 including the bottom surface BF and the side surfaces of a dielectric layer Lyr18 including the upper surface UF. The shield electrode SSE helps to prevent noise from entering the low pass filter 1 and also helps to prevent noise from being emitted to the outside.

A multilayer low pass filter such as the low pass filter 1 may be used in an apparatus that is strongly demanded to be reduced in size such as a portable wireless communication device. In the case where a multilayer low pass filter including a plurality of LC resonance circuits as illustrated in FIG. 1 is mounted in such a limited space, an air-core portion defined by an inductor may be obstructed by a capacitor or another inductor in the stacking direction. When magnetic flux generated at the air-core portion of the inductor is obstructed by an electrode of the capacitor or the other inductor, an eddy current occurs at the electrode, which generates heat. That is, the eddy-current loss occurs. As a result, the insertion loss of the low pass filter may become worse than expected.

Thus, in the present preferred embodiment, the electrodes of capacitors and the electrodes of inductors are arranged so that the air-core portion defined by an inductor includes a region enabling magnetic flux to pass therethrough in the stacking direction. Compared with the case where the air-core portion defined by an inductor is obstructed by another circuit element, the eddy-current loss is reduced in the preferred embodiment. As a result, the insertion loss of the low pass filter is effectively reduced.

Figure 3:
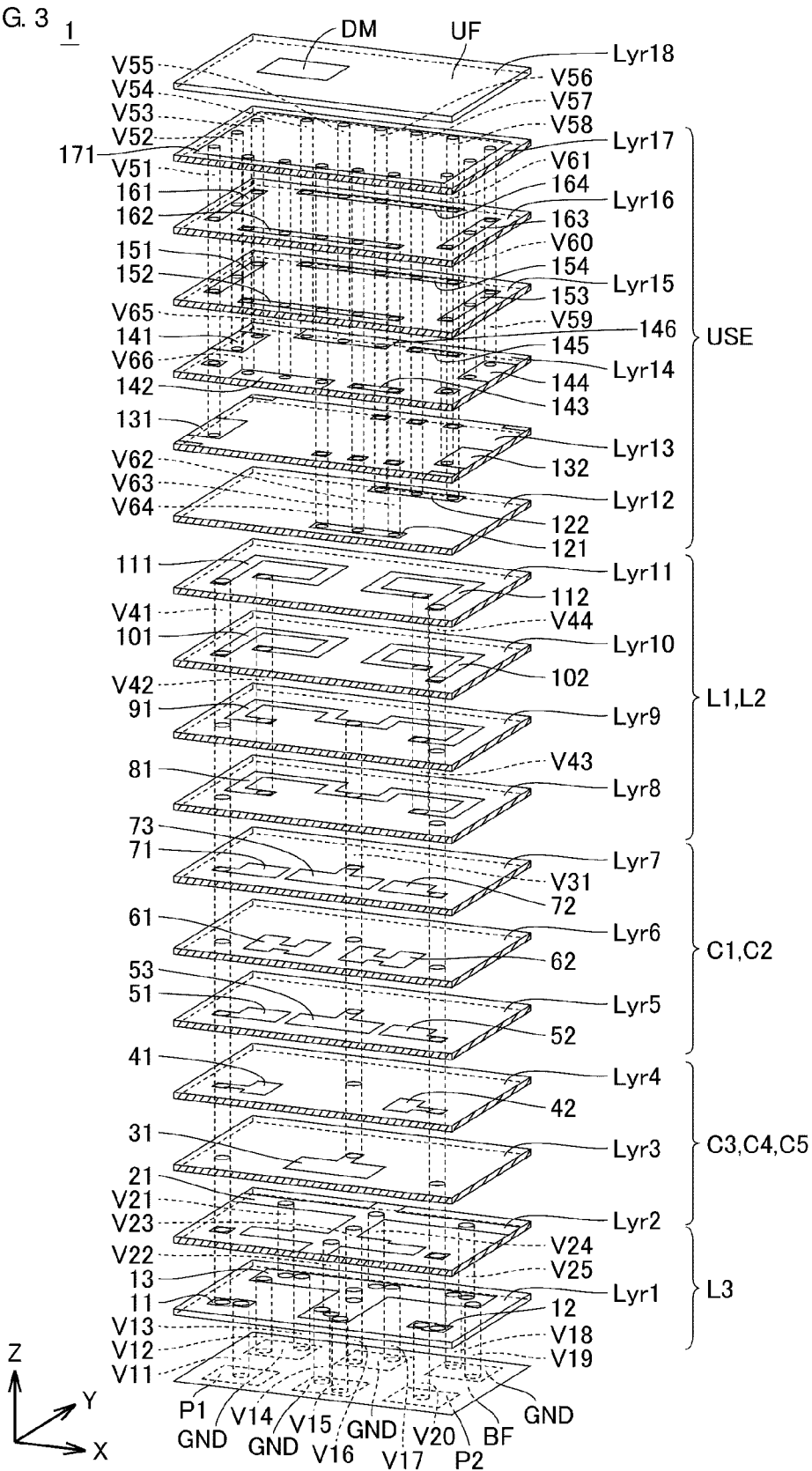
FIG. 3 is an exploded perspective view illustrating a multilayer structure of the low pass filter illustrated in FIG. 1.

FIG. 3 is an exploded perspective view illustrating a multilayer structure of the low pass filter 1 illustrated in FIG. 1. The low pass filter 1 is a multilayer filter including a plurality of dielectric layers. The low pass filter 1 includes the dielectric layers Lyr1 and Lyr18 and dielectric layers Lyr2 to Lyr17 as the plurality of dielectric layers. The dielectric layer Lyr1 is arranged on the side where the bottom surface BF is provided, and the dielectric layer Lyr18 is arranged on the side where the upper surface UF is provided. The dielectric layers Lyr1 to Lyr18 are stacked in this order in the Z-axis direction.

The dielectric layer Lyr1 includes electrodes 11 to 13 located thereon. The electrode 11 is connected to the input-output terminal P1 through a via electrode V11. The electrode 12 is connected to the input-output terminal P2 through a via electrode V20. The electrode 13 is connected to the ground electrodes GND via respective via electrodes V12 to V19.

The dielectric layer Lyr2 includes an electrode 21 located thereon. The electrode 21 is connected to the electrode through via electrodes V21 to V25. The electrode 21 is connected to the ground electrodes GND via the electrode 13. The electrode 21 is connected to the shield electrode SSE at the side surfaces of the dielectric layer Lyr2. A portion of the electrode 21 connecting two side surfaces (the side surfaces SF2 and SF4) facing each other in the X-axis direction among the side surfaces of the dielectric layer Lyr2 intersects a portion of the electrode 21 connecting two side surfaces (the side surfaces SF1 and SF3) facing each other in the Y-axis direction.

The electrodes 13 and 21 and the via electrodes V21 to V25 define the inductor L3. The dielectric layers Lyr1 and Lyr2 correspond to a second inductor layer according to the present preferred embodiment of the present invention.

The dielectric layer Lyr3 includes an electrode 31 located thereon. A portion where the electrode 31 is superposed with the electrode 21 in the stacking direction defines the capacitor C4.

The dielectric layer Lyr4 includes electrodes 41 and 42 located thereon. The electrode 41 is connected to the electrode 11 through a via electrode V41. A portion where the electrode 41 is superposed with the electrode 21 in the stacking direction defines the capacitor C3. The electrode 42 is connected to the electrode 12 through a via electrode V44. A portion where the electrode 42 is superposed with the electrode 21 in the stacking direction defines the capacitor C5.

The dielectric layer Lyr5 includes electrodes 51 to 53 located thereon. The electrode 51 is connected to the electrode 41 through the via electrode V41. The electrode 52 is connected to the electrode 42 through the via electrode V44. The electrode 53 is connected to the electrode 31 through a via electrode V31.

The dielectric layer Lyr6 includes electrodes 61 and 62 located thereon. The electrode 61 is superposed with the electrodes 51 and 53 in the stacking direction. The electrode 62 is superposed with the electrodes 52 and 53 in the stacking direction.

The dielectric layer Lyr7 includes electrodes 71 to 73 located thereon. The electrode 71 is connected to the electrode 51 through the via electrode V41. The electrode 71 is superposed with the electrode 61 in the stacking direction. The electrode 72 is connected to the electrode 52 through the via electrode V44. The electrode 72 is superposed with the electrode 62 in the stacking direction. The electrode 73 is connected to the electrode 53 through the via electrode V31. The electrode 73 is superposed with the electrodes 61 and 62 in the stacking direction.

The electrodes 51, 53, 61, 71, and 73 define the capacitor C1. The electrodes 52, 53, 62, 72, and 73 define the capacitor C2. The dielectric layers Lyr2 to Lyr7 correspond to a capacitor layer according to the present preferred embodiment of the present invention.

The dielectric layer Lyr8 includes an electrode 81 located thereon. The electrode 81 is connected to the electrode 73 through the via electrode V31.

The dielectric layer Lyr9 includes an electrode 91 located thereon. The electrode 91 is connected to the electrode 81 through the via electrode V31. The electrode 91 has the same shape as the electrode 81, and almost the entire area of the electrode 91 is superposed with the electrode 81 in the stacking direction.

The dielectric layer Lyr10 includes electrodes 101 and 102 located thereon. The electrode 101 is connected to the electrode 71 through the via electrode V41. The electrode 101 is connected to the electrode 91 through a via electrode V42. The electrode 101 is superposed with the electrode 91 in the stacking direction. The electrode 102 is connected to an electrode 92 through a via electrode V43. The electrode 102 is connected to the electrode 72 through the via electrode V44. The electrode 102 is superposed with the electrode 91 in the stacking direction.

The dielectric layer Lyr11 includes electrodes 111 and 112 located thereon. The electrode 111 is connected to the electrode 101 through the via electrodes V41 and V42. The electrode 111 has the same shape as the electrode 101. Almost the entire area of the electrode 111 is superposed with the electrode 101 in the stacking direction. The electrode 112 is connected to the electrode 102 through the via electrodes V43 and V44. The electrode 112 has the same shape as the electrode 102, and almost the entire area of the electrode 112 is superposed with the electrode 102 in the stacking direction.

The electrodes 81, 91, 101, and 111 and the via electrodes V41 and V42 define the inductor L1. The electrodes 81, 91, 102, and 112 and the via electrodes V43 and V44 define the inductor L2. The dielectric layers Lyr10 and Lyr11 correspond to a first inductor layer according to the present preferred embodiment of the present invention.

The electrodes 81 and 91 preferably have the same or substantially the same shape, and superpose with each other in the stacking direction. The same applies to the electrodes 101 and 111 and to the electrodes 102 and 112. With such shapes and arrangements, the volume (or a cross-sectional area) in which a current flows increases. As a result, the magnetic flux generated from the inductors L1 and L2 increases, and the effective inductances of the inductors L1 and L2 increase. As a result, the Q factor of the low pass filter 1 is increased.

The dielectric layer Lyr12 includes electrodes 121 and 122 located thereon. The dielectric layer Lyr13 includes electrodes 131 and 132 located thereon. The electrode 131 is connected to the shield electrode SSE at the side surface SF2. The electrode 132 is connected to the shield electrode SSE at the side surface SF4.

The dielectric layer Lyr14 includes electrodes 141 to 146 located thereon. The electrodes 141, 142, 144, and 146 are connected to the shield electrode SSE at the respective side surfaces SF2, SF1, SF4, and SF3. The electrode 142 is connected to the electrode 121 through a via electrode V64. The electrode 143 is connected to the electrode 121 through via electrodes V62 and V63. The electrode 145 is connected to the electrode 122 through via electrodes V57 and V58. The electrode 146 is connected to the electrode 122 through a via electrode V56.

The dielectric layer Lyr15 includes electrodes 151 to 154 located thereon. The electrode 151 is connected to the electrode 131 through a via electrode V51. The electrode 151 is connected to the electrode 141 through via electrodes V52 and V53. The electrode 152 is connected to the electrode 142 through the via electrode V64 and via electrodes V65 to V66. The electrode 152 is connected to the electrode 143 through the via electrodes V62 and V63. The electrode 153 is connected to the electrode 144 through via electrodes V59 and V60. The electrode 153 is connected to the electrode 132 through a via electrode V61. The electrode 154 is connected to the electrode 146 through via electrodes V54 and V55 and the via electrode V56. The electrode 154 is connected to the electrode 145 through the via electrodes V57 and V58.

The dielectric layer Lyr16 includes electrodes 161 to 164 located thereon. The electrode 161 is connected to the electrode 151 through the via electrodes V51 to V53. The electrode 162 is connected to the electrode 152 through the via electrodes V62 to V66. The electrode 163 is connected to the electrode 153 through the via electrodes V59 to V61. The electrode 164 is connected to the electrode 154 through the via electrodes V54 to V58.

The dielectric layer Lyr17 includes an electrode 171 located thereon. The electrode 171 is connected to the electrode 161 through the via electrodes V51 to V53. The electrode 171 is connected to the electrode 162 through the via electrodes V62 to V66. The electrode 171 is connected to the electrode 163 through the via electrodes V59 to V61. The electrode 171 is connected to the electrode 164 through the via electrodes V54 to V58. When the dielectric layer Lyr1 is seen from the dielectric layer Lyr17 in the stacking direction, the electrode 171 covers the inductors L1 and L2, the capacitors C1 to C5, and the inductor L3.

The dielectric layers Lyr12 to Lyr17 define a shielding layer USE. In the shielding layer USE, the electrode 171 receives noise from the upper surface UF and noise emitted from the inside of the low pass filter 1, and transfer the noise to the shield electrode SSE via the electrodes 131, 132, 141, 142, 144, and 146.

The noise transferred to the shield electrode SSE is transferred to the electrode 21 and thereafter to the ground electrodes GND via the electrode 13. Since the electrode 13 is interposed between the electrode 21 and the ground electrodes GND, the noise is dispersed at the electrode 13. In the low pass filter 1, the noise may be attenuated at the electrode 13 and then transferred to the ground electrodes GND. As a result, compared with the case having no electrode 13, noise may be prevented from entering the inside of the low pass filter 1 from the outside, and also noise may be prevented from leaking to the outside of the low pass filter 1 from the inside.

In the case where the side surfaces of the dielectric layer Lyr1 are covered with the shield electrode SSE, stray capacitance occurs between the shield electrode SSE and the via electrodes V11 to V20. Thus, the impedance of the low pass filter decreases, which may result in impedance mismatching. As a result, the return loss of the low pass filter 1 may become worse. The return loss of the low pass filter 1 may be prevented from becoming worse by not covering the side surfaces of the dielectric layer Lyr1 with the shield electrode SSE.

Figure 4:
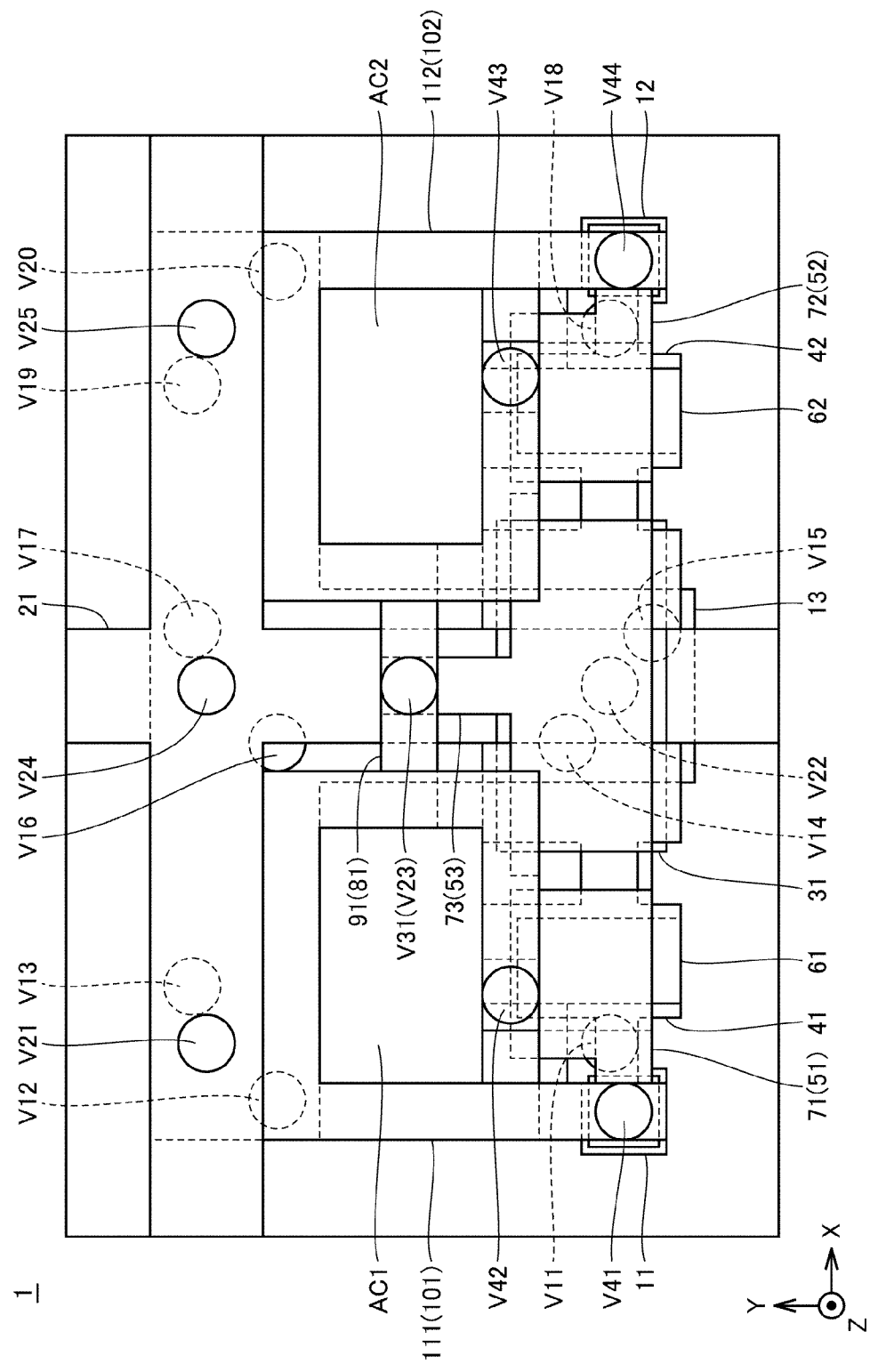
FIG. 4 is a diagram illustrating a view of a second inductor layer seen from a first inductor layer illustrated in FIG. 3 in the stacking direction.

FIG. 4 is a diagram illustrating a view of the dielectric layer Lyr1 (the second inductor layer) seen from the dielectric layer Lyr11 (the first inductor layer) illustrated in FIG. 3 in the stacking direction. An air-core portion AC1 is defined by the inductor L1 (the electrodes 81, 91, 101, and 111 and the via electrodes V41 and V42), and an air-core portion AC2 is defined by the inductor L2 (the electrodes 81, 91, 102, and 112 and the via electrodes V43 and V44). As illustrated in FIG. 4, in the region from the dielectric layer Lyr11 to the dielectric layer Lyr1, each of the air-core portion AC1 and the air-core portion AC2 is not superposed with the capacitor C1 (the electrodes 51, 53, 61, 71, and 73), the capacitor C2 (the electrodes 52, 53, 62, 72, and 73), the capacitor C3 (the electrodes 21 and 41), the capacitor C4 (the electrodes 21 and 31), the capacitor C5 (the electrodes 21 and 42), and the inductor L3 (the electrodes 13 and 21 and the via electrodes V21 to V25). That is, the magnetic flux generated at the air-core portions AC1 and AC2 is not obstructed by an electrode of the inductor L3 and electrodes of the capacitors C1 to C5. Thus, in the low pass filter 1, the eddy-current loss that occurs at the electrodes of the inductor L3 and capacitors C1 to C5 when the magnetic flux is obstructed by the electrodes is prevented. As a result, the insertion loss is reduced.

Figure 5:
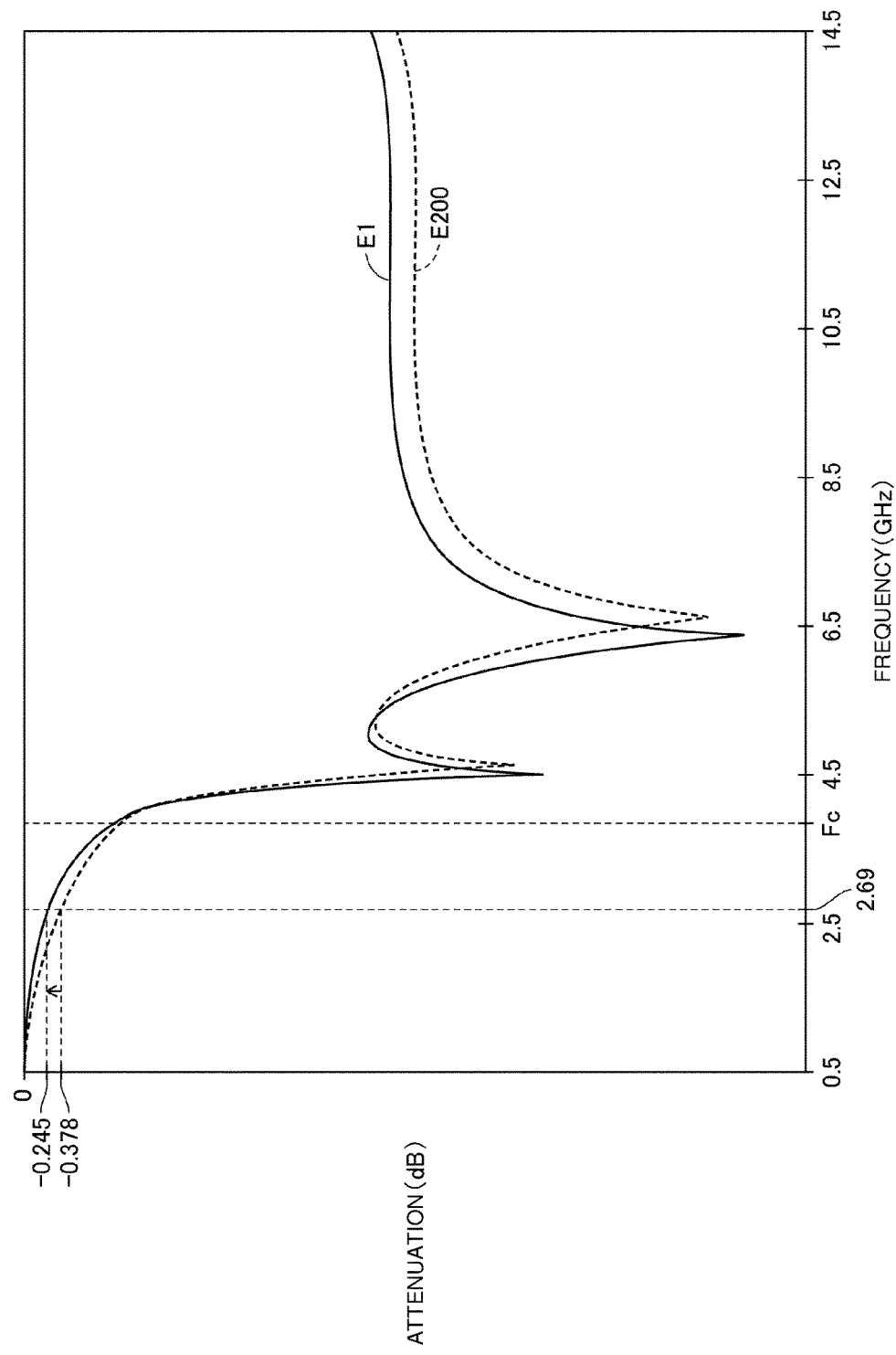
FIG. 5 is a diagram illustrating simulation results regarding attenuation characteristics of a low pass filter according to a preferred embodiment of the present invention together with simulation results regarding attenuation characteristics of a low pass filter according to a comparison example.

FIG. 5 is a diagram illustrating simulation results regarding attenuation characteristics of the low pass filter 1 according to the present preferred embodiment together with simulation results regarding attenuation characteristics of a low pass filter according to a comparison example. It is assumed in the low pass filter according to the comparison example that the air-core portion defined by an inductor is obstructed by at least any of the electrodes of an inductor and the electrodes of a capacitor.

In FIG. 5, the vertical axis shows attenuation (dB) as negative values. The greater the absolute value of the attenuation, the greater the insertion loss. Either of the low pass filter 1 and the low pass filter according to the comparison example has a pass band up to a frequency Fc. A solid line E1 indicates the attenuation characteristics of the low pass filter 1. A broken line E200 indicates the attenuation characteristics of the low pass filter according to the comparison example.

Smaller insertion loss is preferable in the pass band. As illustrated in FIG. 5, the insertion loss of the low pass filter 1 is smaller than that of the low pass filter according to the comparison example in the pass band. For example, the insertion loss is reduced by almost 35% at a frequency of about 2.69 GHz included in the pass band.

Regarding a low pass filter, it may be desired that the frequency at which an attenuation pole appears be changed depending on the purpose of use. The frequency at which an attenuation pole appears may be changed in the present preferred embodiment by changing the number of via electrodes connecting the electrode 21 with the electrode 13.

Figure 6:
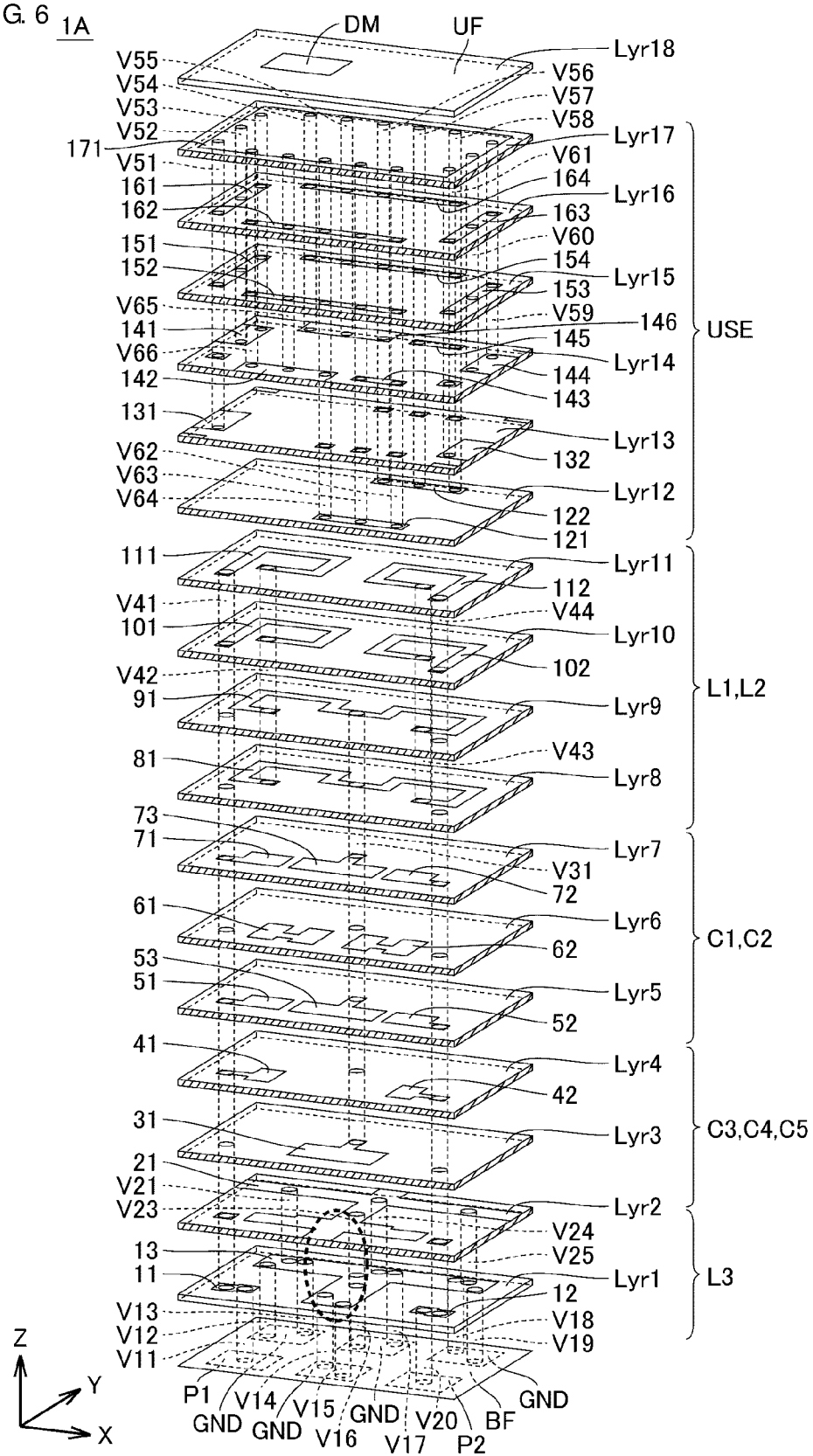
FIG. 6 is an exploded perspective view illustrating a multilayer structure of a low pass filter obtained by removing a via electrode from the low pass filter illustrated in FIG. 3.

FIG. 6 is an exploded perspective view illustrating a multilayer structure of a low pass filter 1A obtained by removing the via electrode V22 from the low pass filter 1 illustrated in FIG. 3. The multilayer structure of the low pass filter 1A is substantially the same as that of the low pass filter 1 except for the absence of the via electrode V22, and thus the description thereof will not be repeated.

As illustrated in FIG. 6, in the case where the via electrode V22 is absent, a possible path from a portion of the electrode 21 that is a part of the capacitor C3 (the portion of the electrode 21 being superposed with the electrode 31) to one of the ground electrodes GND may be the path through the via electrode V23, the electrode 13, and the via electrode V14, or the path through the via electrode V23, the electrode 13, and the via electrode V16. In contrast, in the case where the via electrode V22 is present, with reference to FIG. 3, a possible path is the path through the via electrode V22, the electrode 13, and the via electrode V14 or the path through the via electrode V22, the electrode 13, and the via electrode V15. The lengths of the paths from the portion of the electrode 21 that is a part of the capacitor C3 to the ground electrodes GND are longer in the case where the via electrode V22 is absent (see FIG. 6). That is, the lengths of the paths from the connection point between the electrode 21 and the via electrode V22 to the ground electrodes GND through the via electrode V22 are shorter than the lengths of the paths from the connection point to the ground electrodes GND through the via electrode V23 (see FIG. 3).

The length of the path from the portion of the electrode that is a part of the capacitor C3 to one of the ground electrodes GND is the length of the path of the inductor L3. When the length of the path of the inductor L3 becomes longer, the inductance of the inductor L3 increases. Thus, the resonant frequency of the LC series resonator SLC1 illustrated in FIG. 1 becomes lower. As a result, the frequency at which an attenuation pole appears becomes lower. In such a manner, the length of the path of the inductor L3 may be changed by changing the number of via electrodes connecting the electrode 13 with the electrode 21 in the present preferred embodiment. As a result, the frequency at which an attenuation pole appears may be changed.

Figure 7:
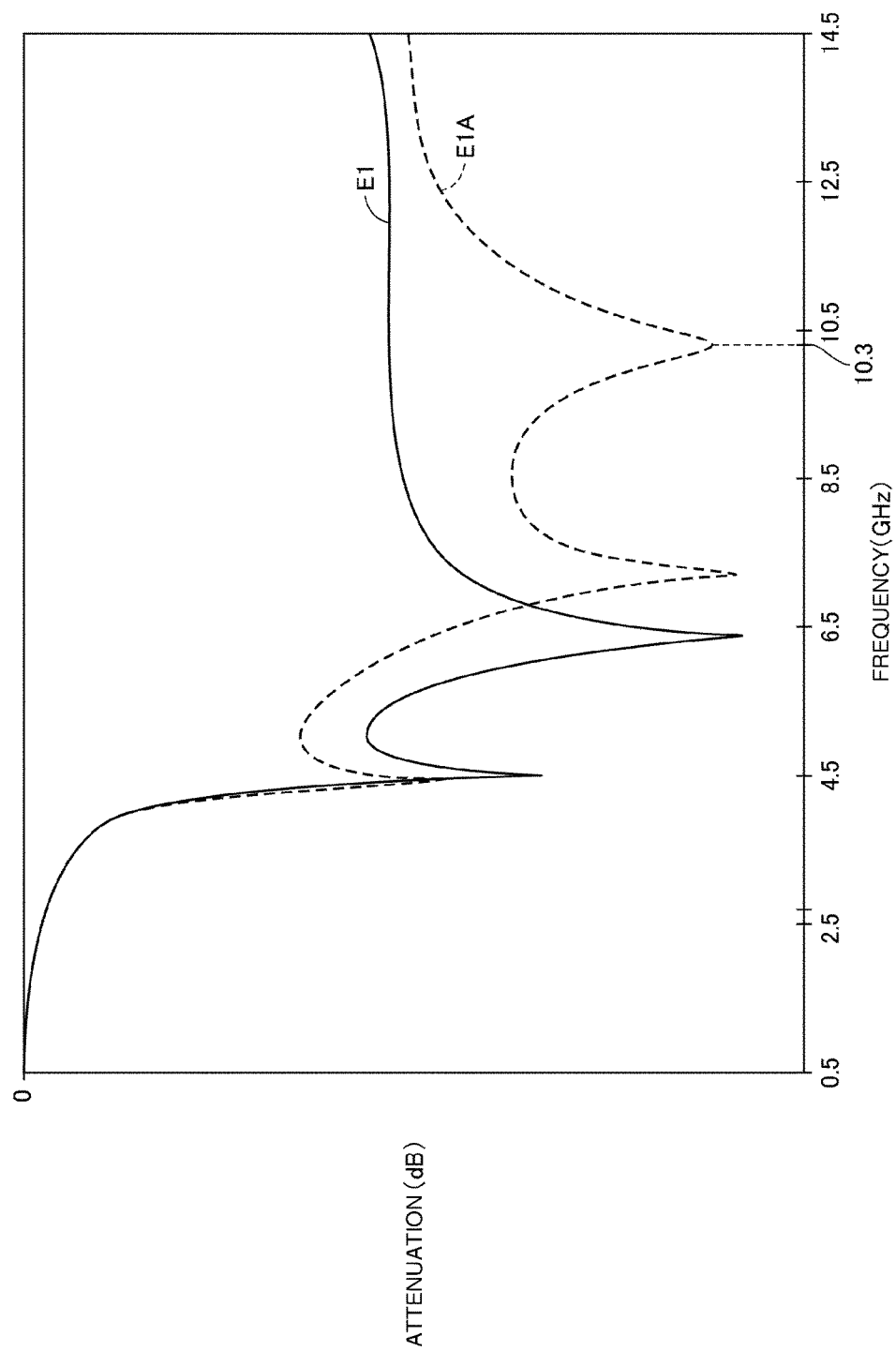
FIG. 7 is a diagram illustrating simulation results regarding the attenuation characteristics of the low pass filter illustrated in FIG. 3 together with simulation results regarding attenuation characteristics of the low pass filter illustrated in FIG. 6.

FIG. 7 is a diagram illustrating simulation results regarding the attenuation characteristics of the low pass filter 1 illustrated in FIG. 3 together with simulation results regarding attenuation characteristics of the low pass filter 1A illustrated in FIG. 6. In FIG. 7, a solid line E1 indicates the attenuation characteristics of the low pass filter 1, and is the same as the solid line E1 illustrated in FIG. 5. A broken line E1A indicates the attenuation characteristics of the low pass filter 1A.

As illustrated in FIG. 7, regarding the low pass filter 1 (the solid line E1), no attenuation region occurs in a frequency band of about 8.5 GHz to about 14.5 GHz, for example. Regarding the low pass filter 1, an attenuation pole appears at a frequency higher than about 14.5 GHz, and thus the attenuation pole does not appear in FIG. 7. In contrast, regarding the low pass filter 1A (the broken line E1A), an attenuation pole appears at a frequency near 10.3 GHz. Regarding the low pass filter 1A, the inductance of the inductor L3 increases since the via electrode V22 is absent, and thus the resonant frequency of the LC series resonator SLC1 becomes lower. As a result, the frequency at which an attenuation pole appears becomes lower and close to 10.3 GHz.

According to the low pass filters according to the preferred embodiments above, since the air-core portion of an inductor is not obstructed by capacitors or another inductor, the insertion loss is reduced compared with the case where the air-core portion of the inductor is obstructed by the capacitors or the other inductor.

Since the entire region of the air-core portion of any inductor is not superposed with the capacitors or the other inductor in the above-described preferred embodiments, the magnetic flux generated at the air-core portion is not obstructed by electrodes of the capacitors or an electrode of the other inductor. Thus, the insertion loss is further reduced.

In addition, the inductor included in the LC series resonator includes the electrodes of two layers of a preferred embodiment of the present invention, and the frequency at which an attenuation pole appears may be changed by changing the length of the path of the inductor by changing the number of via electrodes connecting the electrodes of the two layers.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer filter comprising:
   a plurality of dielectric layers;
   a first LC parallel resonator including a first inductor and a first capacitor;
   a second LC parallel resonator including a second inductor and a second capacitor; and
   an LC series resonator including third, fourth and fifth capacitors, and a third inductor including one end connected to a ground point; wherein
   the plurality of dielectric layers include:
      a first inductor layer in which the first inductor and the second inductor are provided;
      a second inductor layer in which the third inductor is provided; and
      a capacitor layer in which the first, second, third, fourth and fifth capacitors are provided and that is located between the first inductor layer and the second inductor layer;
   at least one of a first air-core portion defined by the first inductor and a second air-core portion defined by the second inductor includes, in a region from the first inductor layer to the second inductor layer in a stacking direction of the plurality of dielectric layers, a region enabling magnetic flux to pass therethrough without being obstructed by the first, second, third, fourth and fifth capacitors and the third inductor;
   the multilayer filter includes a shield electrode that covers at least a portion of one of side surfaces of the multilayer filter extending in the stacking direction; and
   the third inductor is connected to the shield electrode at side surfaces of the second inductor layer extending in the stacking direction.

2. The multilayer filter according to claim 1, further comprising:
   a first terminal; and
   a second terminal; wherein
   one end of the first inductor is connected to the first terminal;
   the second inductor is connected between the other end of the first inductor and the second terminal;
   the first capacitor is connected in parallel with the first inductor;
   the second capacitor is connected in parallel with the second inductor;
   the third capacitor is connected between the other end of the third inductor and the first terminal;
   the fourth capacitor is connected between the other end of the third inductor and the other end of the first inductor; and
   the fifth capacitor is connected between the other end of the third inductor and the second terminal.

3. The multilayer filter according to claim 1, wherein each of the first air-core portion and the second air-core portion is not superposed with the first, second, third, fourth and fifth capacitors and the third inductor in the region from the first inductor layer to the second inductor layer in the stacking direction.

4. The multilayer filter according to claim 1, further comprising an identification mark on a top surface of the multilayer filter.

5. The multilayer filter according to claim 1, wherein the shield electrode is provided on all of the side surfaces of the multilayer filter.

6. The multilayer filter according to claim 1, wherein the second inductor layer includes:
   a first dielectric layer on which a first electrode is provided;
   a second dielectric layer on which a second electrode is provided; and
   a first via electrode extending in the stacking direction; wherein
   the second dielectric layer is located between the first dielectric layer and ground;
   the first electrode is connected to the shield electrode at the side surfaces of the second inductor layer; and
   the first electrode and the second electrode are connected by the first via electrode.

7. The multilayer filter according to claim 6, wherein
   the second inductor layer further includes a second via electrode that connects the first electrode with the second electrode;
   a length of a path of the third inductor corresponds to a length of a path from the first dielectric layer to the ground point; and
   a length of a path from a connection point between the first dielectric layer and the second via electrode to the ground point by the second via electrode is shorter than a length of a path from the connection point to the ground point by the first via electrode.

8. The multilayer filter according to claim 6, wherein the side surfaces of the second dielectric layer are not covered with the shield electrode.

9. The multilayer filter according to claim 1, wherein the multilayer filter is a low pass filter.

10. The multilayer filter according to claim 1, wherein the multilayer filter has a rectangular or substantially rectangular parallelepiped shape.

11. The multilayer filter according to claim 1, further comprising input-output terminals and ground terminals on a bottom surface of the multilayer filter.

* * * * *